(12) United States Patent
Pai et al.

(10) Patent No.: US 10,276,438 B2
(45) Date of Patent: Apr. 30, 2019

(54) MARKED PIXEL UNIT, DISPLAY DEVICE USING THE SAME, AND METHOD FOR FABRICATING THE DISPLAY DEVICE

(71) Applicant: AU OPTRONICS CORPORATION, Hsin-chu (TW)

(72) Inventors: Chia-Hui Pai, Hsin-chu (TW); Wen-Hsien Tseng, Hsin-chu (TW); Hsin-Ju Wu, Hsin-chu (TW); Yh-Hung Lee, Hsin-chu (TW); You-Yuan Hu, Hsin-chu (TW); Teng-Yi Wang, Hsin-chu (TW); Wei-Chieh Chen, Hsin-chu (TW); Kuan-Yi Lee, Hsin-chu (TW); Kuan-Hsien Wu, Hsin-chu (TW); Chih-chun Yang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 16 days.

(21) Appl. No.: 15/646,236

(22) Filed: Jul. 11, 2017

(65) Prior Publication Data

US 2018/0061709 A1 Mar. 1, 2018

(30) Foreign Application Priority Data

Aug. 23, 2016 (TW) .............................. 105126940 A

(51) Int. Cl.
*H01L 21/768* (2006.01)
*H01L 27/146* (2006.01)
(Continued)

(52) U.S. Cl.
CPC ........ *H01L 21/76897* (2013.01); *H01L 23/50* (2013.01); *H01L 27/11539* (2013.01);
(Continued)

(58) Field of Classification Search
CPC ......... H01L 27/14621; H01L 21/76897; G02F 1/133514; G02F 2001/136222; G02F 2001/133354
See application file for complete search history.

(56) References Cited

U.S. PATENT DOCUMENTS 7,944,540 B2 * 5/2011 Kim .................. G02F 1/133514
349/106

FOREIGN PATENT DOCUMENTS

| CN | 100380216 | 4/2008 |
| JP | 2002182242 A | 6/2002 |
| TW | 200643582 A | 12/2006 |

OTHER PUBLICATIONS

Office Action issued by (TIPO) Intellectual Property Office, Ministry of Economic Affairs, R. O. C. dated Sep. 28, 2017 for Application No. 105126940, Taiwan.

* cited by examiner

*Primary Examiner* — Xuemei Zheng
(74) *Attorney, Agent, or Firm* — Tim Tingkang Xia, Esq.; Locke Lord LLP

(57) ABSTRACT

A marked pixel unit includes at least one active element, a first dielectric layer, a color filter unit, a second dielectric layer, and at least one pixel electrode. The active element includes a source, a gate, and a drain. The first dielectric layer is configured to cover the gate. The color filter unit is disposed above the first dielectric layer, and has an alignment opening. The second dielectric layer is disposed above the active element and the color filter unit, and has a contact hole. The pixel electrode is disposed above the second dielectric layer, and electrically connected to the drain through the contact hole. The contact hole of the second dielectric layer is located outside the alignment opening.

15 Claims, 13 Drawing Sheets

(51) Int. Cl.
    *H01L 23/50*     (2006.01)
    *H01L 27/11539*     (2017.01)
    *H01L 27/12*     (2006.01)
    *H01L 29/417*     (2006.01)

(52) U.S. Cl.
    CPC ........ *H01L 27/124* (2013.01); *H01L 27/1259* (2013.01); *H01L 27/14621* (2013.01); *H01L 29/41733* (2013.01)

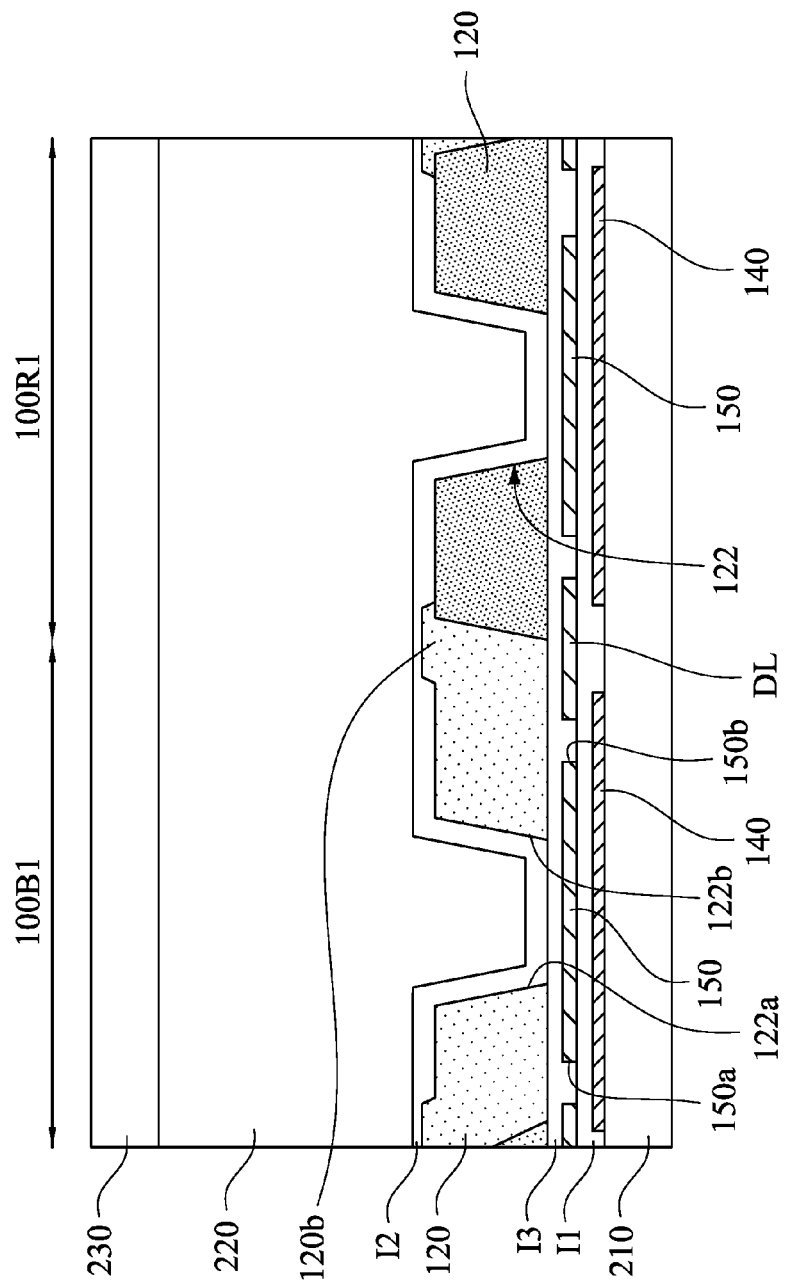

MARKED PIXEL UNIT, DISPLAY DEVICE USING THE SAME, AND METHOD FOR FABRICATING THE DISPLAY DEVICE

CROSS-REFERENCE TO RELATED PATENT APPLICATION

This application claims the benefit of priority to Taiwan Patent Application No. 105126940, filed Aug. 23, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

Certain following embodiments relate to a marked pixel unit, a display device using the same, and a method for fabricating the display device.

BACKGROUND

With the gradual progress of display technologies, assistance of displays can make life of people more convenient. To achieve attributes of small weight and small thickness of displays, flat panel displays (flat panel display; FPD) have been prompted to become current mainstreams. In a variety of flat panel displays, liquid crystal displays (liquid crystal display; LCD) have advantages such as high space utilization efficiency, low power consumption, no radiation, and low electromagnetic interference, and therefore liquid crystal displays are well received by consumers.

In general liquid crystal displays, an active element array substrate integrated with a color filter film (Color filter On Array; COA) and an active element array substrate integrated with a black matrix (Black Matrix On Array: BOA) have become current mainstreams. For the current COA substrate or BOA substrate, an issue of mis-alignment between a color filter film and a film under the color filter film on a same substrate generally affects the display quality and product yield. How to quickly determine whether there is a mis-alignment issue and determining whether the mis-alignment degree is within a tolerable range is one of topics concerned by designers.

SUMMARY

According to certain embodiments, a marked pixel unit is provided, which includes at least one active element, a first dielectric layer, a color filter unit, a second dielectric layer, and at least one pixel electrode. The active element includes a source, a gate, and a drain. The first dielectric layer is configured to cover the gate. The color filter unit is disposed above the first dielectric layer, where the color filter unit has an alignment opening. The second dielectric layer is configured to cover the active element and the color filter unit, where the second dielectric layer has a contact hole. The pixel electrode is disposed above the second dielectric layer, where the pixel electrode is electrically connected to the drain through the contact hole, and the contact hole of the second dielectric layer is located outside the alignment opening.

In certain embodiments, the marked pixel unit further includes a bottom electrode and a top electrode of a capacitor. The top electrode is electrically connected to the drain, where the first dielectric layer is disposed between the bottom electrode and the top electrode, and the alignment opening of the color filter unit is disposed above the capacitor top electrode.

In certain embodiments, the color filter unit covers or does not cover two opposite edges of the capacitor top electrode.

In certain embodiments, an orthographic projections of each of the edges of the top electrode on an upper surface of the color filter unit is substantively parallel to an orthographic projection of each of two opposite side walls of the alignment opening of the color filter unit on the upper surface of the color filter unit.

In certain embodiments, an area of an orthographic projection of the alignment opening on the top electrode is smaller than an area of the top electrode.

In certain embodiments, the color filter unit does not cover the active element and the contact hole.

According to certain embodiments, a display device, including a substrate, at least one marked pixel unit and at least one unmarked pixel unit, is introduced. The marked pixel unit and the unmarked pixel unit are disposed above the substrate. Each of the at least one marked pixel unit and the at least one unmarked pixel unit includes a color filter unit, where the color filter unit of the marked pixel unit includes an alignment opening; the unmarked pixel unit includes a spacer, which is disposed above the color filter unit of the unmarked pixel unit, where a location of an orthographic projection of the spacer on the color filter unit of the unmarked pixel unit corresponds to a location of the alignment opening in the color filter unit of the marked pixel unit.

In certain embodiments, the marked pixel unit further includes at least one active element, a first dielectric layer, a color filter unit, a second dielectric layer, and at least one pixel electrode. The active element includes a source, a gate, and a drain. The first dielectric layer is configured to cover the gate. The color filter unit is disposed above the first dielectric layer, where the color filter unit has an alignment opening. The second dielectric layer is configured to cover the active element and the color filter unit, where the second dielectric layer has a contact hole. The pixel electrode is disposed above the second dielectric layer, where the pixel electrode is electrically connected to the drain through the contact hole, and the contact hole of the second dielectric layer is located outside the alignment opening.

In certain embodiments, the at least one marked pixel unit and the at least one unmarked pixel unit are arranged in an array; the at least one marked pixel unit includes a first marked pixel unit and a second marked pixel unit, and the first marked pixel unit and the second marked pixel unit are located in a same row of the array.

In certain embodiments, a transmission spectrum of the color filter unit of the first marked pixel unit is substantively the same as that of the color filter unit of the second marked pixel unit.

In certain embodiments, the unmarked pixel unit is at least partially disposed between the first marked pixel unit and the second marked pixel unit.

In certain embodiments, the substrate includes a first exposed area and a second exposed area; the first exposed area has a first edge adjacent to the second exposed area and a second edge away from the second exposed area; the at least one marked pixel unit includes a first marked pixel unit and a second marked pixel unit; the first marked pixel unit and the second marked pixel unit are disposed in the first exposed area, and are respectively adjacent to the first edge and the second edge of the first exposed area.

In certain embodiments, the second exposed area has a third edge adjacent to the first exposed area and a fourth edge away from the first exposed area; the at least one marked pixel unit further includes a third marked pixel unit and a fourth marked pixel unit; the third marked pixel unit and the fourth marked pixel unit are disposed in the second exposed area, and are respectively adjacent to the third edge and the fourth edge of the second exposed area.

According to certain embodiments, a method for fabricating a display device is provided, which includes: forming a first color filter layer on a substrate, where at least one marked pixel unit is disposed above the substrate, and the marked pixel unit includes an active element and a top electrode of a capacitor, which is electrically connected to the active element; patterning the first color filter layer to form at least one first color filter unit, where the first color filter unit has an alignment opening that corresponds to the top electrode, where a conductive through hole is located outside the alignment opening; detecting a location of the top electrode of the marked pixel unit and a location of the alignment opening of the first color filter unit; according to the detection result, determining to calibrate the patterned first color filter layer or to form a second color filter layer on the substrate; and forming a dielectric layer on the first color filter unit, where the dielectric layer has a contact hole, which is located outside the alignment opening.

In certain embodiments, the patterning the first color filter layer includes: exposing the first color filter layer in a first exposed area of the substrate using an exposure machine; and moving the substrate by a preset distance, and exposing, by the exposure machine, the first color filter layer in a second exposed area of the substrate, where the first exposed area is adjacent to the second exposed area, and the calibrating the patterned first color filter layer includes adjusting by the preset distance.

In certain embodiments, the detecting a location of the capacitor top electrode of the marked pixel unit and a location of the alignment opening of the first color filter unit includes: detecting locations of two opposite edges of the capacitor top electrode to determine a center of the top electrode in a direction; and detecting locations of two opposite edges of the alignment opening to determine a center of the alignment opening in the direction, where an orthographic projection of each of the edges of the top electrode on the substrate is substantively parallel to an orthographic projection of each of the side walls of the alignment opening of the color filter unit on the substrate.

BRIEF DESCRIPTION OF THE DRAWINGS

FIG. 3C is a schematic cross-sectional view along a line 3C-3C of FIG. 3B.

DETAILED DESCRIPTION

Figure 1A:
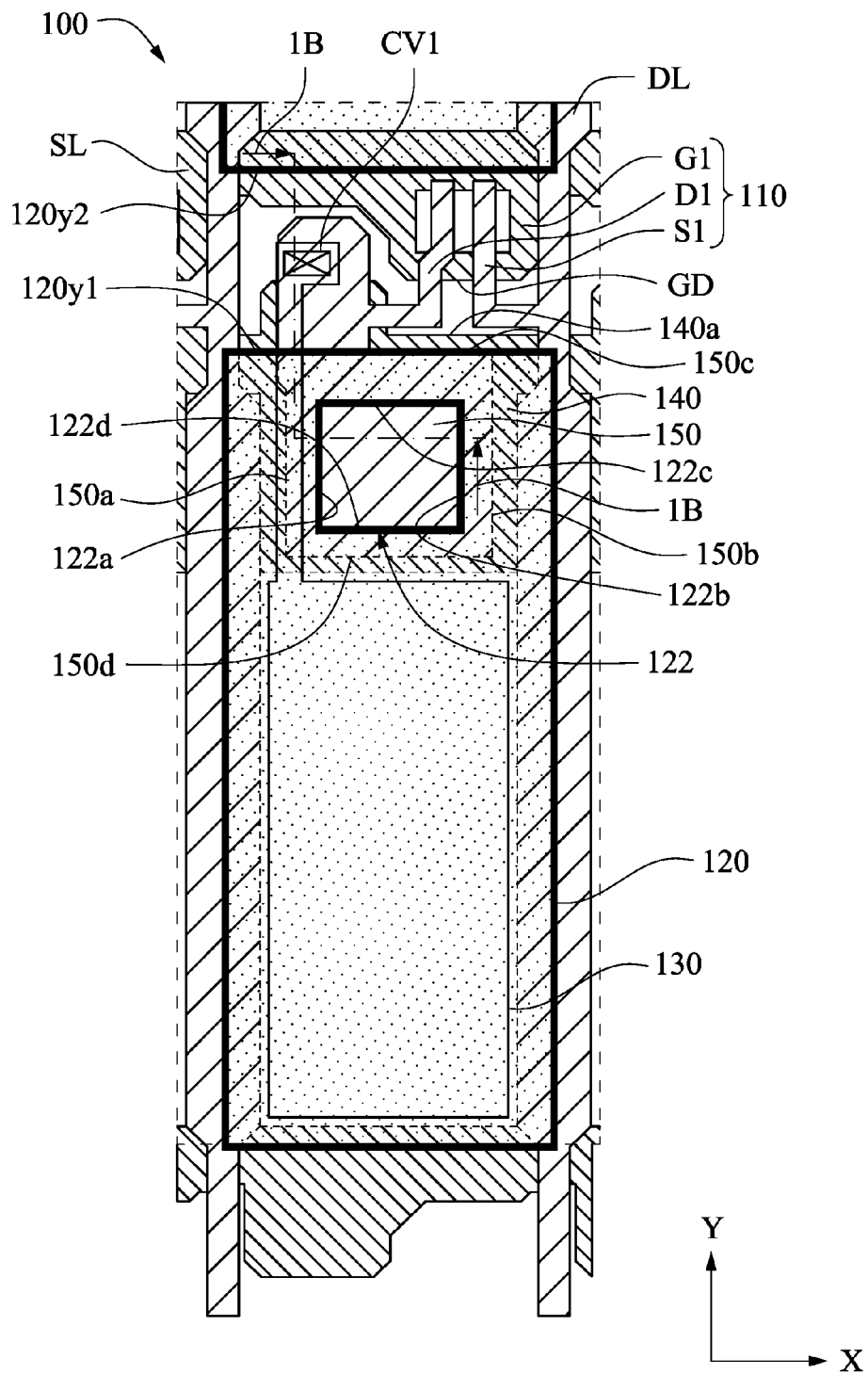
FIG. 1A is a schematic top view of a marked pixel unit according to an implementation.

A plurality of embodiments are disclosed below with accompanying drawings. For description clearness, a lot of practical details are described together in the following description. However, it should be known that the practical details should not be used to limit the present invention. That is, in some implementations of the present invention, the practical details are unnecessary. In addition, to simplify drawings, some conventional structures and elements are drawn in a simple illustrative manner in the drawings.

Figure 1B:
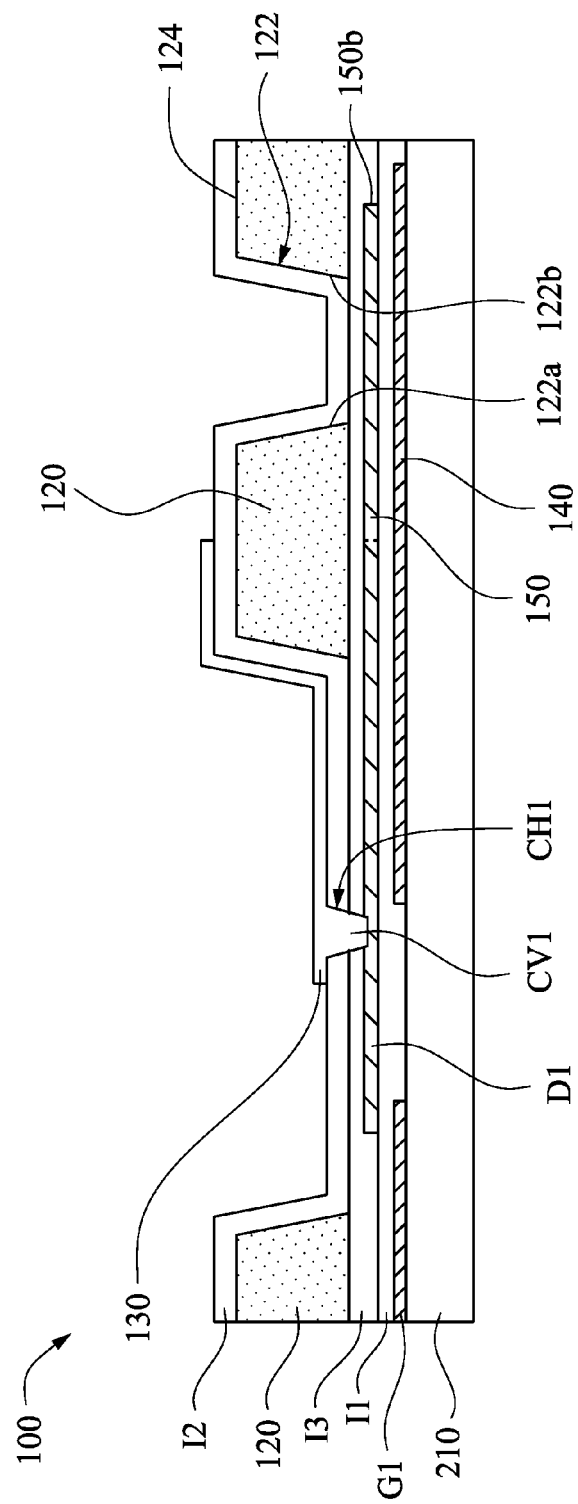
FIG. 1B is a schematic cross-sectional view along a line 1B-1B of FIG. 1A.

FIG. 1A is a schematic top view of a marked pixel unit 100 according to an implementation. FIG. 1B is a schematic cross-sectional view along a line 1B-1B of FIG. 1A. Refer to FIG. 1A and FIG. 1B at the same time. The marked pixel unit 100 is disposed above a substrate 210. The marked pixel unit 100 includes a data line DL, a scanning line SL, at least one active element 110, a first dielectric layer I1, a color filter unit 120, a second dielectric layer I2, and at least one pixel electrode 130. The active element 110 includes a source S1, a gate G1, and a drain D1. The data line DL and the scanning line SL are respectively connected to the source S1 and the gate G1 of the active element 110. The first dielectric layer I1 is configured to cover the gate G1. The color filter unit 120 is disposed above the first dielectric layer I1 and has an alignment opening 122. The second dielectric layer I2 is configured to cover the active element 110 and the color filter unit 120. The second dielectric layer I2 has a contact hole CH1. The pixel electrode 130 is disposed above the second dielectric layer I2, and the pixel electrode 130 is electrically connected to the drain D1 through the contact hole CH1. In other words, the pixel electrode 130 is filled in the contact hole CH1 to form a conductive through hole CV1, so as to be electrically connected to the drain D1. According to certain embodiments, the contact hole CH1 (or the conductive through hole CV1) is located outside the alignment opening 122.

In certain embodiments, the marked pixel unit 100 further includes a bottom electrode 140 of a capacitor and a top electrode 150 of the capacitor. The top electrode 150 is electrically connected to the drain D1, where the first dielectric layer I1 is disposed between the bottom electrode 140 and the top electrode 150, so that the bottom electrode 140, the first dielectric layer I1, and the top electrode 150 form a capacitor. Herein, the data line DL, the source S1 of the active element 110, and the top electrode 150 are formed by a same conductive layer (for example, metal). The scanning line SL, the gate G1 of the active element 110, and the bottom electrode 140 are formed by a same conductive layer (for example, metal).

According to certain embodiments, a location of the alignment opening 122 of the marked pixel unit 100 is designed to correspond to the top electrode 150, and a location of the top electrode 150 is compared with that of the alignment opening 122 to measure a mis-alignment degree of the exposed color filter unit 120 relative to the layer where the top electrode 150 is located. In certain embodiments, an area of an orthographic projection of the alignment opening 122 on the top electrode 150 is smaller than that of the top electrode 150, so that the color filter unit 120 covers two opposite edges 150a and 150b of the top electrode 150. In this way, when detecting the edges 150a and 150b of the top electrode 150, light penetrates through a same medium (including the color filter unit 120), so that the edges 150a and 150b of the top electrode 150 can be observed on a same focal plane. In this way, the mis-alignment degree of the exposed color filter unit 120 relative to the layer where the top electrode 150 is located can be measured by means of detecting two opposite side walls 122a and 122b of the alignment opening 122 of the marked pixel unit 100 and the edges 150a and 150b of the top electrode 150.

Although it is not drawn herein, in other embodiments, the color filter unit 120 may be designed not to cover the two opposite edges 150a and 150b of the top electrode 150, that is, an area of the orthographic projection of the alignment opening 122 on the top electrode 150 is greater than that of the top electrode 150, so that the two opposite edges 150a and 150b of the top electrode 150 are not covered by the color filter unit 120. Similarly, light penetrates through a same medium (not including the color filter unit 120), so that the edges 150a and 150b of the top electrode 150 can be observed on a same focal plane.

According to certain embodiments, orthographic projections, which are on an upper surface 124 of the color filter unit 120, of the edges 150a and 150b of the top electrode 150 are substantively parallel to each other. In this way, a large range can be provided to detect locations of the edges 150a and 150b. Similarly, orthographic projections, which are on the upper surface 124 of the color filter unit 120, of the two opposite side walls 122a and 122b of the alignment opening 122 of the color filter unit 120 are substantively parallel to each other, so that a large range can be provided to detect locations of the side walls 122a and 122b.

According to certain embodiments, the orthographic projections of the edges 150a and 150b of the top electrode 150 on the upper surface 124 of the color filter unit 120 are substantively parallel to the orthographic projections of two opposite side walls 122a and 122b of the alignment opening 122 of the color filter unit 120 on the upper surface 124 of the color filter unit 120. In this way, centers of the top electrode 150 and the alignment opening 122 in an X direction can be obtained so as to determine a mis-alignment degree of the color filter unit 120 in the X direction.

To achieve a better detection, a structure for detecting a mis-alignment degree in a Y direction may also be designed. According to certain embodiments, by means of edges 150c and 150d of the top electrode 150 and two opposite side walls 122c and 122d of the alignment opening 122, the mis-alignment degree in the Y direction may be detected in a similar manner.

A size of a pixel structure of a high resolution display is excessively small, and it is usually difficult to accurately control a size of an opening of the color filter unit 120 in the small-sized pixel structure. Layout of elements on the pixel structure of a high resolution display is dense, and consequently, a light emitting area adjacent to the active element 110 is excessively small. On such basis, in some implementations, the color filter unit 120 is designed not to cover the active element 110 and the contact hole CH1 (or the conductive through hole CV1); the problem caused by poor control of the size of the opening of the color filter unit 120 may be avoided in a case of not affecting the light transmission. In certain embodiments, in a case in which the color filter unit 120 does not cover the active element 110 and the contact hole CH1 (or the conductive through hole CV1), an edge GD of the gate G1 and an edge 140a of the bottom electrode 140 may be detected, and an edge 120y1 of the color filter unit 120 and an edge 120y2 of the color filter unit 120 of another pixel structure is detected, so as to obtain the mis-alignment degree in the Y direction. By combining the mis-alignment degree in the X direction and the mis-alignment degree in the Y direction, information about a two-dimensional mis-alignment degree can be obtained.

As described above, the top electrode 150, the gate G1, and the bottom electrode 140 are used as examples of objectives to which the alignment opening 122 of the color filter unit 120 is aligned, but the actual application is not limited thereto, and other electrodes (the data line DL, the source S1, and the scanning line SL) may also be designed as objectives for alignment. In other embodiments, the marked pixel unit 100 may not include the bottom electrode 140, and the top electrode 150 drawn in the drawings may be used as designs for other objectives, and is not limited to use for forming a capacitor.

In certain embodiments, the active element 110 may be one of the various semiconductor elements, for example, a transistor, a diode, or other suitable elements, and materials of the semiconductor elements include polysilicon, monocrystalline silicon, microcrystalline silicon, amorphous silicon, organic semiconductor materials, metal oxide semiconductor materials, other suitable materials, or a combination of at least two of the foregoing materials.

In certain embodiments, a third dielectric layer I3 may be disposed between the color filter unit 120 and the top electrode 150. The first dielectric layer I1 may be a single-layer or multi-layer structure; the second dielectric layer I2 may be a single-layer or multi-layer structure; the third dielectric layer I3 may be a single-layer or multi-layer structure, and inorganic materials (for example: silicon oxide, silicon nitride, silicon oxynitride, or other suitable materials), organic materials (for example: photoresists, polyimide, benzocyclobutene or other suitable materials) or other suitable materials are included between each of the first dielectric layer I1, the second dielectric layer I2, and the third dielectric layer I3.

In certain embodiments, the pixel electrode 130 may be selected from various materials with good conductivity, for example, metals, alloys, conductive adhesives, indium tin oxides, indium gallium zinc oxides, indium zinc oxides, carbon nanotubes/rods, other suitable materials, or a combination of at least two of the foregoing materials. In some implementations, the color filter unit 120 may be formed by photosensitive materials with different transmission spectrums, for example, a red photoresist, a green photoresist, and a blue photoresist. Or the color filter unit 120 may be formed by insulating materials with different transmission spectrums.

Figure 2:
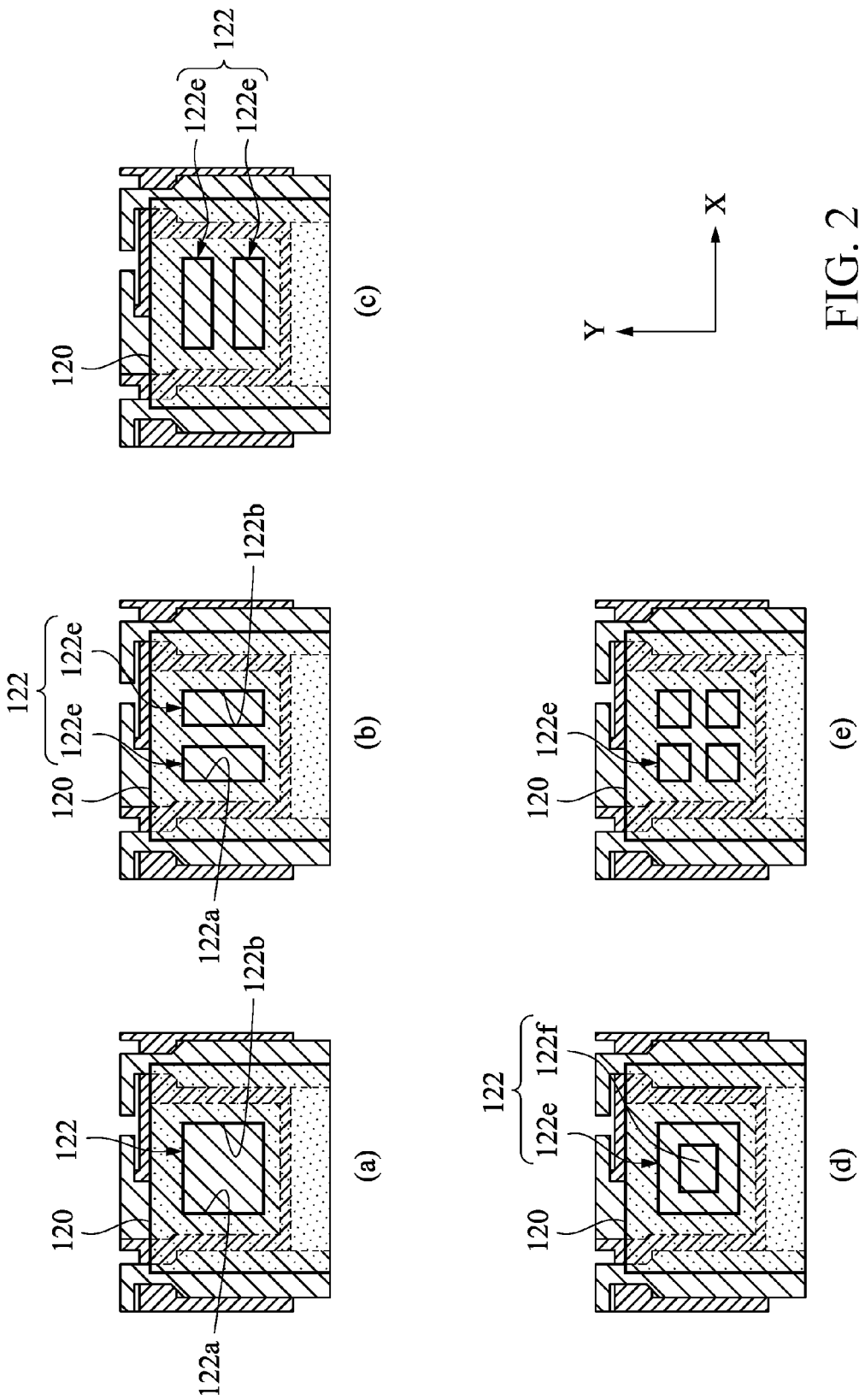
FIG. 2 is a local schematic top view of a marked pixel unit according to each implementation.

Although in the foregoing embodiments, the alignment opening 122 is designed to be a single opening, the scope of the present invention should not be limited thereto. In actual application, the alignment opening 122 may include a plurality of openings. FIG. 2 is a local schematic top view of the marked pixel unit 100 according to each implementation. Herein, it is further listed that the alignment opening 122 of the marked pixel unit 100 may have various different patterns. Specifically, in embodiment (a), the alignment opening 122 may be purely an opening. In embodiment (b), the alignment opening 122 may have two openings 122e, which are disposed opposite in the X direction. In embodiment (c), the alignment opening 122 may have two openings 122e, which are disposed opposite in the Y direction. In embodiment (d), the alignment opening 122 may have an opening 122e and an island 122f located in the opening 122e. In embodiment (e), the alignment opening 122 may have four openings 122e, which are disposed in an array of the X direction and the Y direction.

In the foregoing embodiments, the alignment opening 122 still can form the side walls 122a and 122b whose orthographic projections are parallel to each other. On such basis, by means of the edges 150a and 150b of the top electrode 150 and the two opposite side walls 122a and 122b of the alignment opening 122, the mis-alignment degree in the X direction can be detected.

Figure 3A:
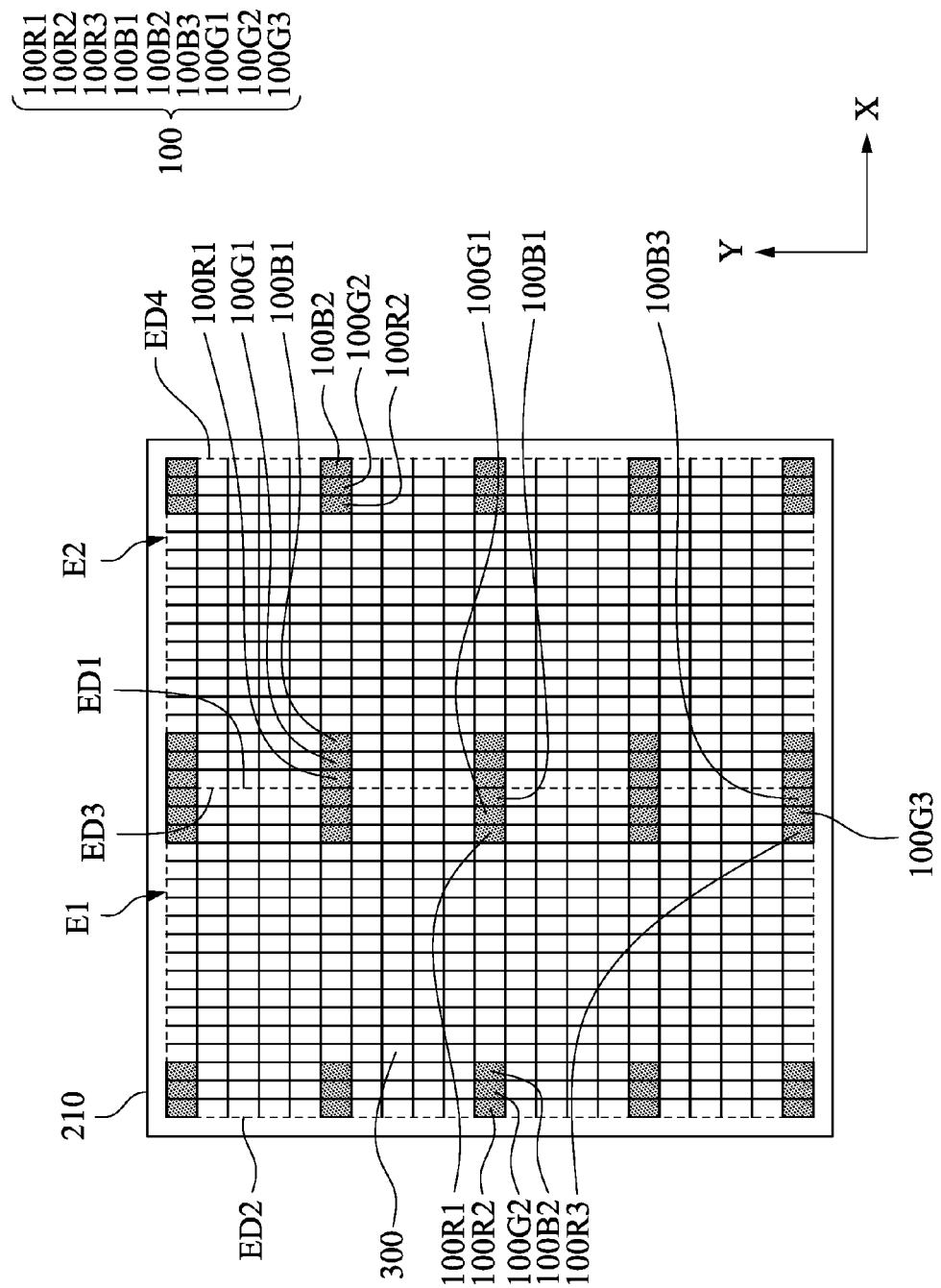
FIG. 3A is a schematic top view of a display device according to an implementation.

FIG. 3A is a schematic top view of a display device 200 according to an embodiment. The display device 200 includes a substrate 210, at least one marked pixel unit 100, and at least one unmarked pixel unit 300. The substrate 210 has a first exposed area E1 and a second exposed area E2. The marked pixel unit 100 and the unmarked pixel unit 300 are arranged on the substrate 210 in an array, and are disposed at least in the first exposed area E1. Herein, the first exposed area E1 refers to a dashed box on the left side of the substrate 210, and the second exposed area E2 refers to a dashed box on the right side of the substrate 210. The first exposed area E1 is adjacent to the second exposed area E2. In certain embodiments, a size of the first exposed area E1 may be the same as that of the second exposed area E2. In other embodiments, the size of the first exposed area E1 may be different from that of the second exposed area E2.

In certain embodiments, a structure of the marked pixel unit 100 is different from that of the unmarked pixel unit 300, so that the marked pixel unit 100 has an alignment opening 122 (referring to FIG. 1A), thereby facilitating detecting a mis-alignment degree of a color filter unit relative to the substrate, so as to determine whether to continue the process or correct the exposure accuracy of the color filter unit and reform the color filter unit. The difference between the structures of the marked pixel unit 100 and the unmarked pixel unit 300 will be subsequently mentioned.

In certain embodiments, because there are a great number of mis-alignment factors, and mis-alignment degrees of pixel units are inconsistent, the mis-alignment degree is not necessarily determined depending upon a single marked pixel unit 100. In an embodiment in which a plurality of marked pixel units 100 is set, locations of the marked pixel units 100 may be designed to match each other, so as to achieve a good detection effect. Specifically, the marked pixel units 100 include a first marked pixel unit 100R1 and a second marked pixel unit 100R2. The first marked pixel unit 100R1 and the second marked pixel unit 100R2 are located on a same row of the array. In this way, by means of the first marked pixel unit 100R1 and the second marked pixel unit 100R2 located on the same row, displacement in an X direction can be detected. Similarly, the marked pixel units 100 may further include a third marked pixel unit 100R3 and the first marked pixel unit 100R1, and the third marked pixel unit 100R3 are located on a same column of the array. In this way, by means of the first marked pixel unit 100R1 and the third marked pixel unit 100R3 located on the same column, displacement in a Y direction can be detected.

In certain embodiments, the unmarked pixel unit 300 is at least partially disposed between the first marked pixel unit 100R1 and the second marked pixel unit 100R2, or the unmarked pixel unit 300 is at least partially disposed between the first marked pixel unit 100R1 and the third marked pixel unit 100R3. In this way, configuration of the marked pixel units 100 having the alignment opening 122 (referring to FIG. 1A) can be prevented from affecting structural strength of the display device 200.

In certain embodiments, the aforementioned first marked pixel unit 100R1, the second marked pixel unit 100R2, and the third marked pixel unit 100R3 located on the same column or row of the array refer to the first marked pixel unit 100R1, the second marked unit 100R2, and the third marked pixel unit 100R3 with substantively identical transmission spectrums of the color filter unit. Specifically, the color filter unit of the first marked pixel unit 100R1, the second marked unit 100R2, and the third marked pixel unit 100R3 may be a red photoresist.

In certain embodiments, the marked pixel units 100 may further include a first marked pixel unit 100G1, a second marked pixel unit 100G2, and a third marked pixel unit 100G3, where the first marked pixel unit 100G1 and the second marked pixel unit 100G2 are located on a same row of the array, and the first marked pixel unit 100G1 and the third marked pixel unit 100G3 are located on a same column of the array. The color filter unit of the first marked pixel unit 100G1, the second marked unit 100G2, and the third marked pixel unit 100G3 may be a green photoresist.

The marked pixel units 100 may further include a first marked pixel unit 100B1, a second marked pixel unit 100B2, and a third marked pixel unit 100B3, where the first marked pixel unit 100B1 and the second marked pixel unit 100B2 are located in a same row of the array, and the first marked pixel unit 100B1 and the third marked pixel unit 100B3 are located in a same column of the array. The color filter unit of the first marked pixel unit 100B1, the second marked unit 100B2, and the third marked pixel unit 100B3 may be a blue photoresist.

To obtain a colorful display, in the process, by means of steps of disposing color filter layers and exposing and patterning the color filter layers for three times, three color filter units with different transmission spectrums are formed on the substrate. However, the color filter layers are not exposed synchronously, and consequently the color filter layers easily have respective mis-alignment problems. In certain embodiments, the color filter layers have the marked pixel units 100 with colors corresponding thereto, that is, the first marked pixel unit 100R1, the second marked pixel unit 100R2, and the third marked pixel unit 100R3; the first marked pixel unit 100G1, the second marked pixel unit 100G2, and the third marked pixel unit 100G3; and the first marked pixel unit 100B1, the second marked pixel unit 100B2, and the third marked pixel unit 100B3. Therefore, the accuracy of exposing and patterning the color filter layers for three times can be detected by respectively using the marked pixel units with corresponding colors.

On the other aspect, in a process of fabricating a large-sized display device, a color filter layer usually needs to be exposed in a stitching manner, so that the substrate 210 has the first exposed area E1 and the second exposed area E2. In certain embodiments, the first exposed area E1 has a first edge ED1 adjacent to the second exposed area E2 and a second edge ED2 far from the second exposed area E2; the first marked pixel units 100R1, 100G1, and 100B1 and the second marked pixel units 100R2, 100G2, and 100B2 are respectively adjacent to the first edge ED1 and the second edge ED2 of the first exposed area E1. In this way, the first marked pixel units 100R1, 100G1, and 100B1 and the second marked pixel units 100R2, 100G2, and 100B2 can detect a mis-alignment degree of the edges of the first exposed area E1 to achieve accurate detection.

In certain embodiments, the second exposed area E2 has a third edge ED3 adjacent to the first exposed area E1 and a fourth edge ED4 far from the first exposed area E1; the marked pixel units 100 and the unmarked pixel unit 300 are also disposed in the second exposed area E2, and the first marked pixel units 100R1, 100G1, and 100B1 and the second marked pixel units 100R2, 100G2, and 100B2 of the marked pixel units 100 are respectively adjacent to the third edge ED3 and the fourth edge ED4 of the second exposed area E2.

In certain embodiments, in the process of detecting exposure in a stitching manner by means of the marked pixel units, locations of the exposed areas can be selectively corrected according to whether exposure (the first exposed area E1 and the second exposed area E2) on the color filter layers is aligned, so as to achieve a stitching effect with good accuracy.

Figure 3B:
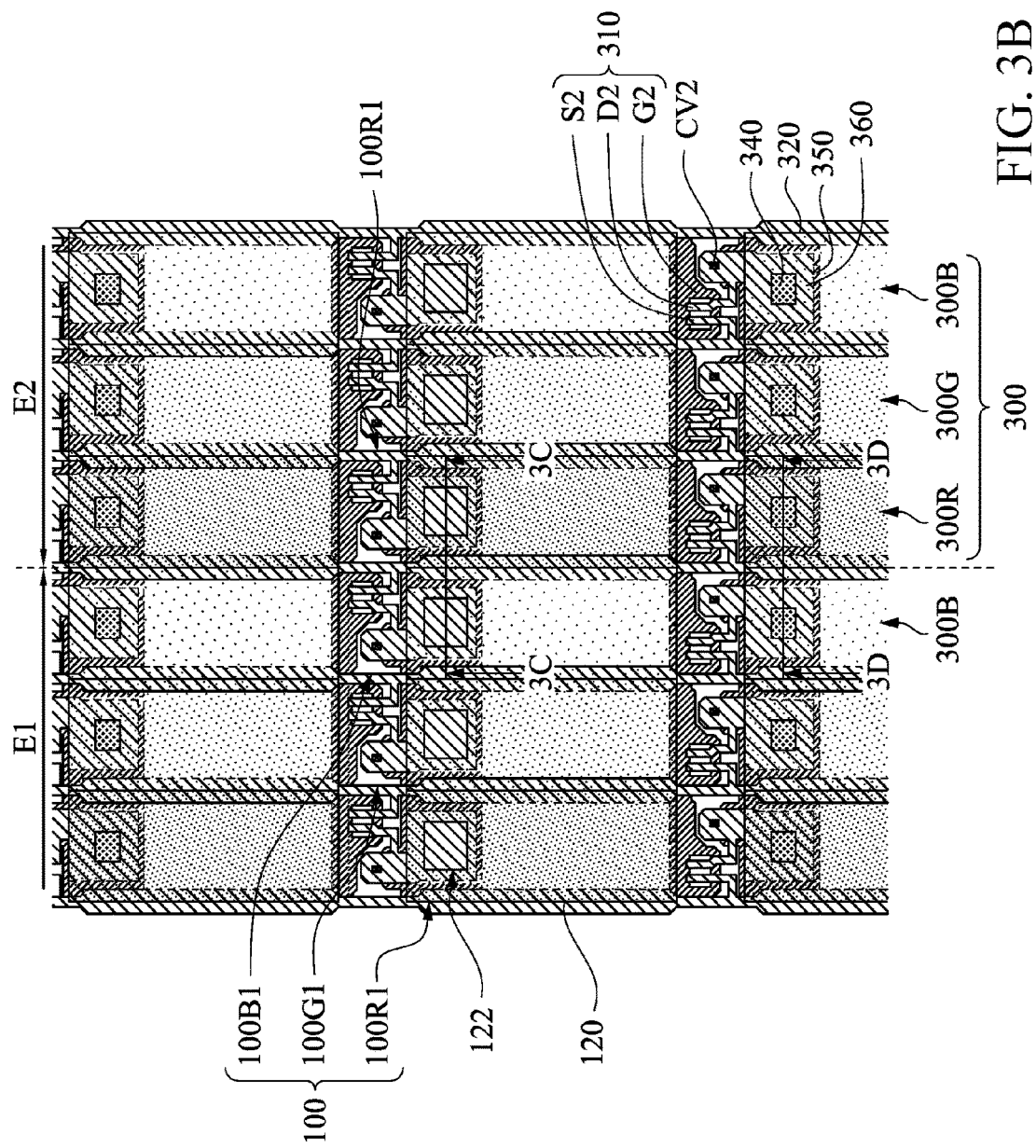
FIG. 3B is a schematic top view of a part adjacent to FIG. 3A.

Refer to FIG. 3A and FIG. 3B at the same time. FIG. 3B is a schematic top view of a part adjacent to FIG. 3A. As shown in the drawings, the first marked pixel units 100R1, 100G1, and 100B1 are disposed in a same row, and the color filter unit 120 of each of the first marked pixel units 100R1, 100G1, and 100B1 has the alignment opening 122. Upon comparison, the unmarked pixel unit 300 does not have the alignment opening 122.

FIG. 3C is a schematic cross-sectional view along a line 3C-3C of FIG. 3B. Herein, photoresists are set in a sequence of red, green and blue, so that the color filter unit 120 of the first marked pixel unit 100B1 has a bridging part 120b on the color filter unit 120 of the first marked pixel unit 100R1. As stated above, the alignment opening 122 is disposed corresponding to a top electrode 150. Herein, the color filter unit 120 covers two opposite edges 150a and 150b of the top electrode 150 to ensure that the edges 150a and 150b of the top electrode 150 can be clearly observed on a same focal plane. In this way, a mis-alignment degree of the exposed color filter unit 120 relative to a layer where the top electrode 150 is located can be measured by means of detecting two opposite side walls 122a and 122b of the alignment opening 122 and the edges 150a and 150b of the top electrode 150.

Figure 3D:
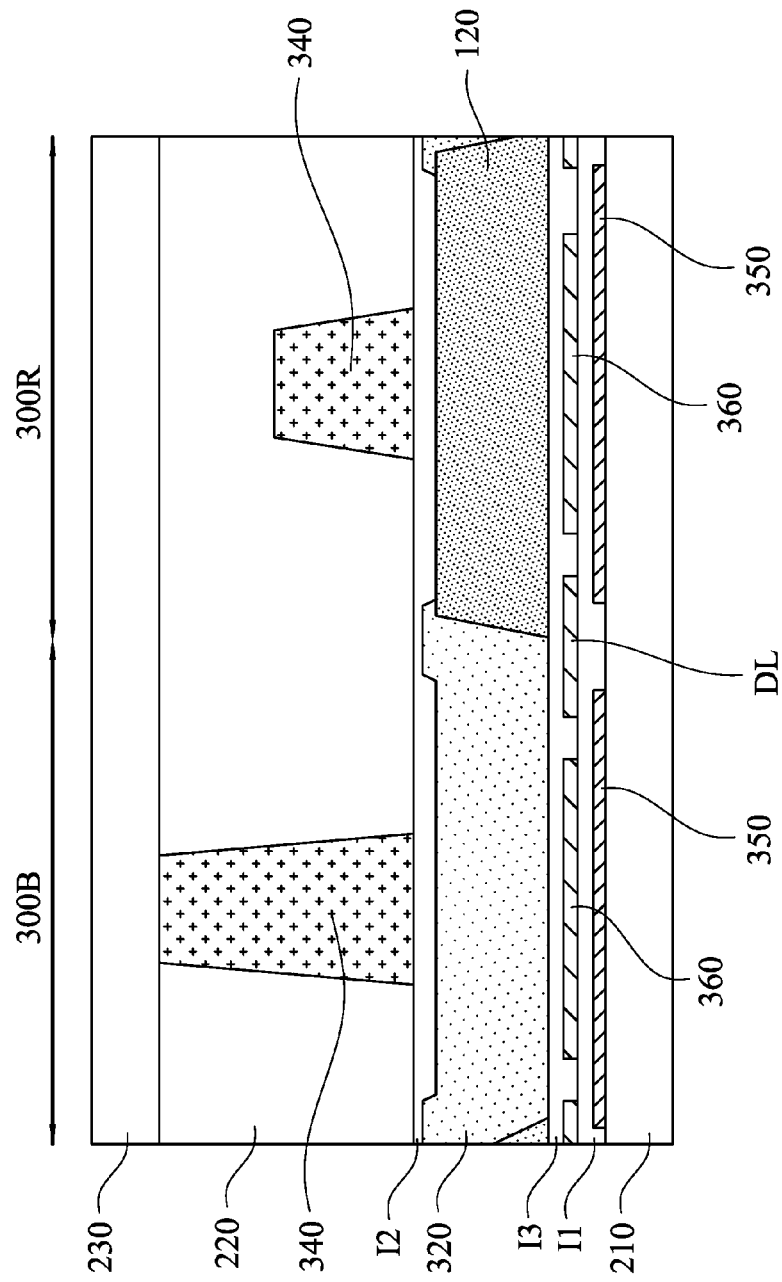
FIG. 3D is a schematic cross-sectional view along a line 3D-3D of FIG. 3B.

FIG. 3D is a schematic cross-sectional view along a line 3D-3D of FIG. 3B. Refer to FIG. 3B and FIG. 3D at the same time. Like the structure of the marked pixel unit 100, each unmarked pixel unit 300 includes at least one active element 310, a first dielectric layer I1, a color filter unit 320, a second dielectric layer I2, and at least one pixel electrode (not drawn). Like the structure of the marked pixel unit 100, the active element 310 includes a source S2, a gate S2, and a drain S2. The first dielectric layer I1 is configured to cover the gate G2. The color filter unit 320 is disposed above the first dielectric layer I1. The second dielectric layer I2 covers the active element 310 and the color filter unit 320, where a conductive through hole CV2 is disposed in the second dielectric layer I2, so that the pixel electrode (not drawn) is electrically connected to a drain D1.

In certain embodiments, the structure of the unmarked pixel unit 300 is approximately similar to that of the marked pixel unit 100, and a difference therebetween can be captured according to FIG. 3A and FIG. 3D, and is not further described with drawings. Specifically, the marked pixel unit 100 mainly differs from the unmarked pixel unit 300 in that: the unmarked pixel unit 300 includes a spacer 340, which is disposed above the color filter unit 320. In certain embodiments, a location of an orthographic projection of the spacer 340 of the unmarked pixel unit 300 on the color filter unit 320 corresponds to a location of the alignment opening 122 in the color filter unit 120; in other words, the spacer 340 of the unmarked pixel unit 300 and the alignment opening 122 of the marked pixel unit 100 have same relative locations in respective pixels. Specifically, a relative location of a center of the spacer 340 in the unmarked pixel unit 300 is substantively the same as a relative location of a center of the alignment opening 122 in the marked pixel unit 100. In certain embodiments, in the unmarked pixel unit 300, the color filter unit 320 does not have the alignment opening and can support setting of the spacer 340. Upon comparison, the marked pixel unit 100 cannot support the spacer due to configuration of the alignment opening 122, and therefore does not have the spacer.

In certain embodiments, the unmarked pixel units 300 include unmarked pixel units 300R, 300G, and 300B. A height of the spacer 340 of the unmarked pixel unit 300R is greater than that of the spacers 340 of the unmarked pixel units 300R and 300G. Specifically, the display apparatus 200 includes a display medium 220 and an opposite substrate 230; the display medium 220 is sandwiched between the substrate 210 and the opposite substrate 230; the spacer 340 of the unmarked pixel unit 300B touch the opposite substrate 230 for supporting a distance between the substrate 210 and the opposite substrate 230. In normal states, the spacers 340 of the unmarked pixel units 300R and 300G may not touch the opposite substrate 230; when the substrate 210 and the opposite substrate 230 are excessively compressed, the spacers 340 of the unmarked pixel units 300R and 300G may touch the opposite substrate 230, so as to support the distance between the substrate 210 and the opposite substrate 230.

It is known that although the color filter units 320 of the unmarked pixel units 300R, 300G, and 300B may be respectively a red photoresist, a green photoresist, and a blue photoresist, the heights of the spacers 340 thereof should not be limited thereto. The heights of the spacers 340 are not necessarily associated with colors of the color filter units 320. In certain embodiments, the spacer 340 may be formed by a dielectric material. In some implementation, the spacer 340 may be a photo spacer, and a material thereof may be photosensitive resin.

Like the structure of the marked pixel unit 100, each of the unmarked pixel units 300 further includes bottom electrode 350 of a capacitor and top electrode 360 of the capacitor. The top electrode 360 is electrically connected to the drain D2. The first dielectric layer I1 is disposed between the bottom electrode 350 and the top electrode 360, so that the bottom electrode 350, the first dielectric layer I1, and the top electrode 360 form a capacitor. In some implementation, the spacer 340 of the unmarked pixel unit 300 is disposed above the top electrode 360.

Like the marked pixel unit 100, it is difficult to accurately control a size of an opening of the color filter unit 320 in the small-sized pixel structure in a high resolution display. Therefore, in some implementation, the color filter unit 320 does not cover the active element 310 and the conductive through hole CV2.

Figure 4:
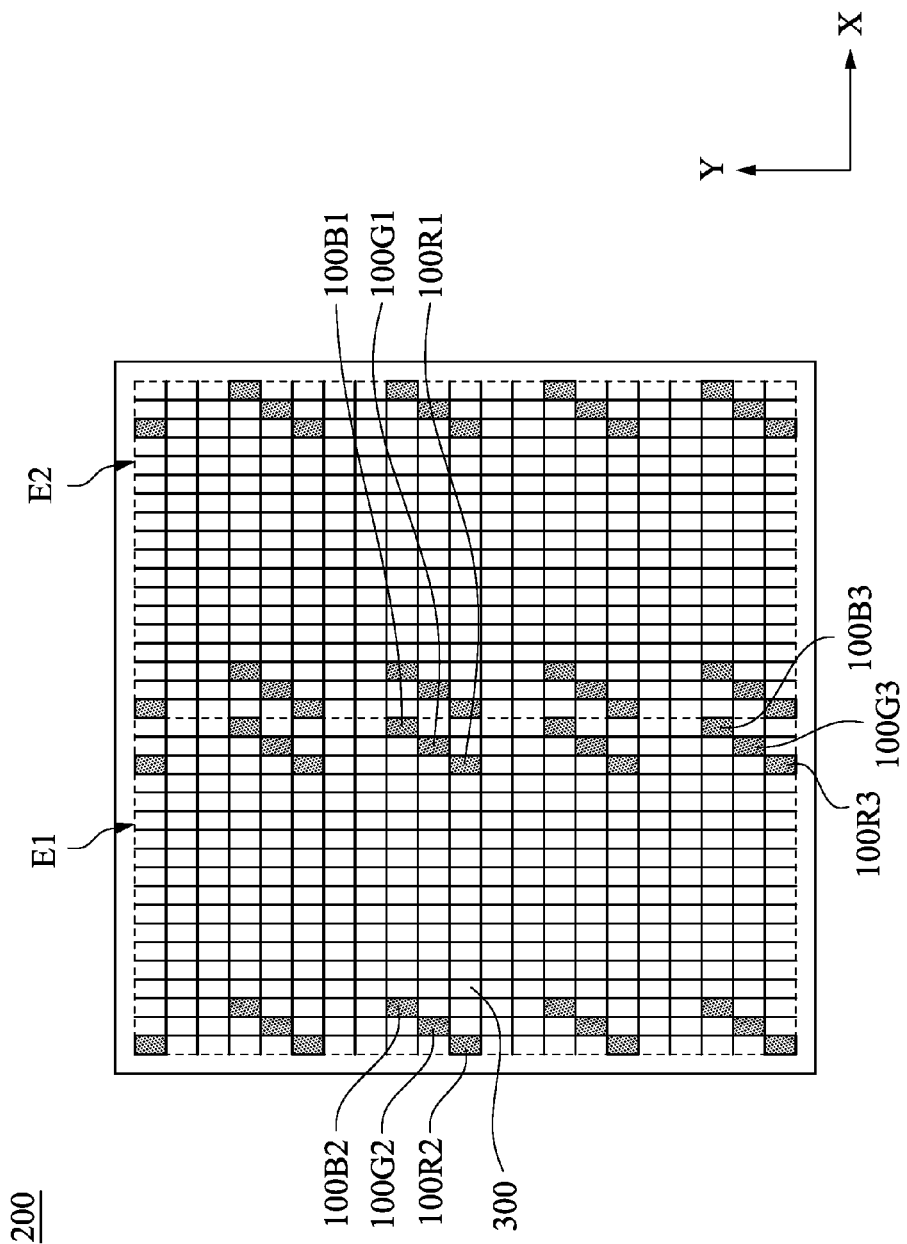
FIG. 4 is a schematic top view of a display device according to another implementation.

Go back to FIG. 3A. Although in the foregoing embodiment, the first marked pixel units 100R1, 100G1, and 100B1 are designed to be located on a same row of an array, in actual application, the scope of the present invention should not be limited thereto. Referring to FIG. 4, FIG. 4 is a schematic top view of the display apparatus 200 according to another implementation manner of the present invention. The present embodiment is similar to the embodiment of FIG. 3A, and the difference lies in that: the first marked pixel units 100R1, 100G1, and 100B1 are respectively located on different rows of an array, and the second marked pixel units 100R2, 100G2, and 100B2 are respectively located on different rows of the array.

Herein, the first marked pixel unit 100R1 is located in a same row of an array as the second marked pixel unit 100R2; the first marked pixel unit 100G1 is located in a same row of the array as the second marked pixel unit 100G2; and the first marked pixel unit 100B1 is located in a same row of the array as the second marked pixel unit 100B2, and location detection in an X direction can still be achieved. The first marked pixel unit 100R1 is located in a same column of an array as the third marked pixel unit 100R3; the first marked pixel unit 100G1 is located in a same column of the array as the third marked pixel unit 100G3; and the first marked pixel unit 100B1 is located in a same column of the array as the third marked pixel unit 100B3, and location detection in a Y direction can still be achieved.

Other details of the present embodiment are approximately stated above, and are not described herein again.

Figure 5:
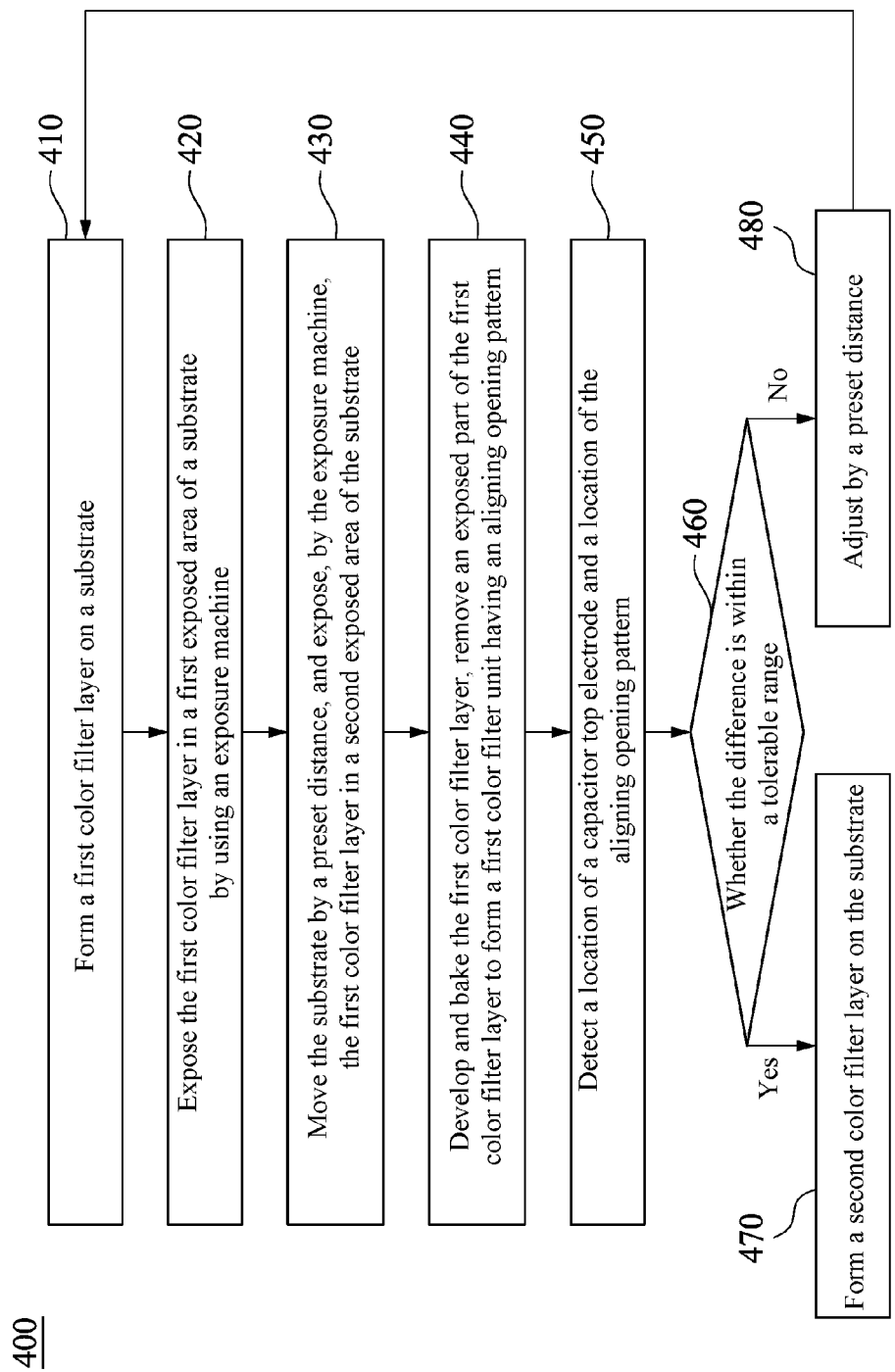
FIG. 5 is flowchart of a method for fabricating a display device according to an implementation.

FIG. 5 is flowchart of a method 400 for fabricating a display device according to an embodiment. The method 400 for fabricating a display device includes steps 410 to 480. FIG. 6A to FIG. 6E are schematic cross-sectional views in a plurality of steps according to the method 400 for fabricating a display device. Refer to FIG. 5 in cooperation with FIG. 6A to FIG. 6E for the following introduction.

Figure 6A:
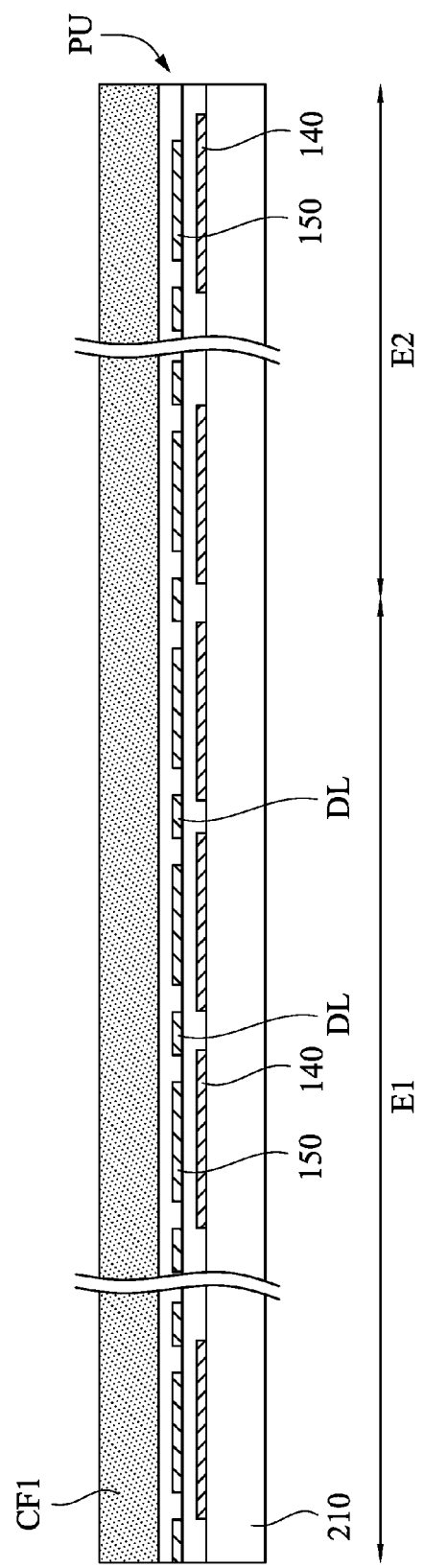
FIG. 6A to 6E are schematic section views in a plurality of steps of a method for fabricating a display device according to an implementation.

First, come to step 410, and refer to FIG. 6A. A first color filter layer CF1 is formed on a substrate 210. At least one marked pixel unit PU is disposed above the substrate 210. Herein, the structure of the marked pixel unit 100 in which the color filter unit 120, the pixel electrode 130, and the conductive through hole CV1 are removed in FIG. 1A may be referred to for the specific structure of the marked pixel unit PU. As shown in FIG. 1A, the marked pixel unit PU includes an active element 110, a bottom electrode 140, and a top electrode 150. The top electrode 150 is electrically connected to the active element 110. Other details of the marked pixel unit PU are approximately stated above, and are not described herein again.

The first color filter layer CF1 may be disposed above the substrate 210 in a spin-coating manner. For example, the first color filter layer CF1 may be a photosensitive material having a transmission spectrum with a specific spectrum, for example, a red photoresist. Herein, the first color filter layer CF1 is a positive photoresist, but the scope of the present invention should not be limited thereto. In other embodiments, the first color filter layer CF1 may be a negative photoresist.

Figure 6B:
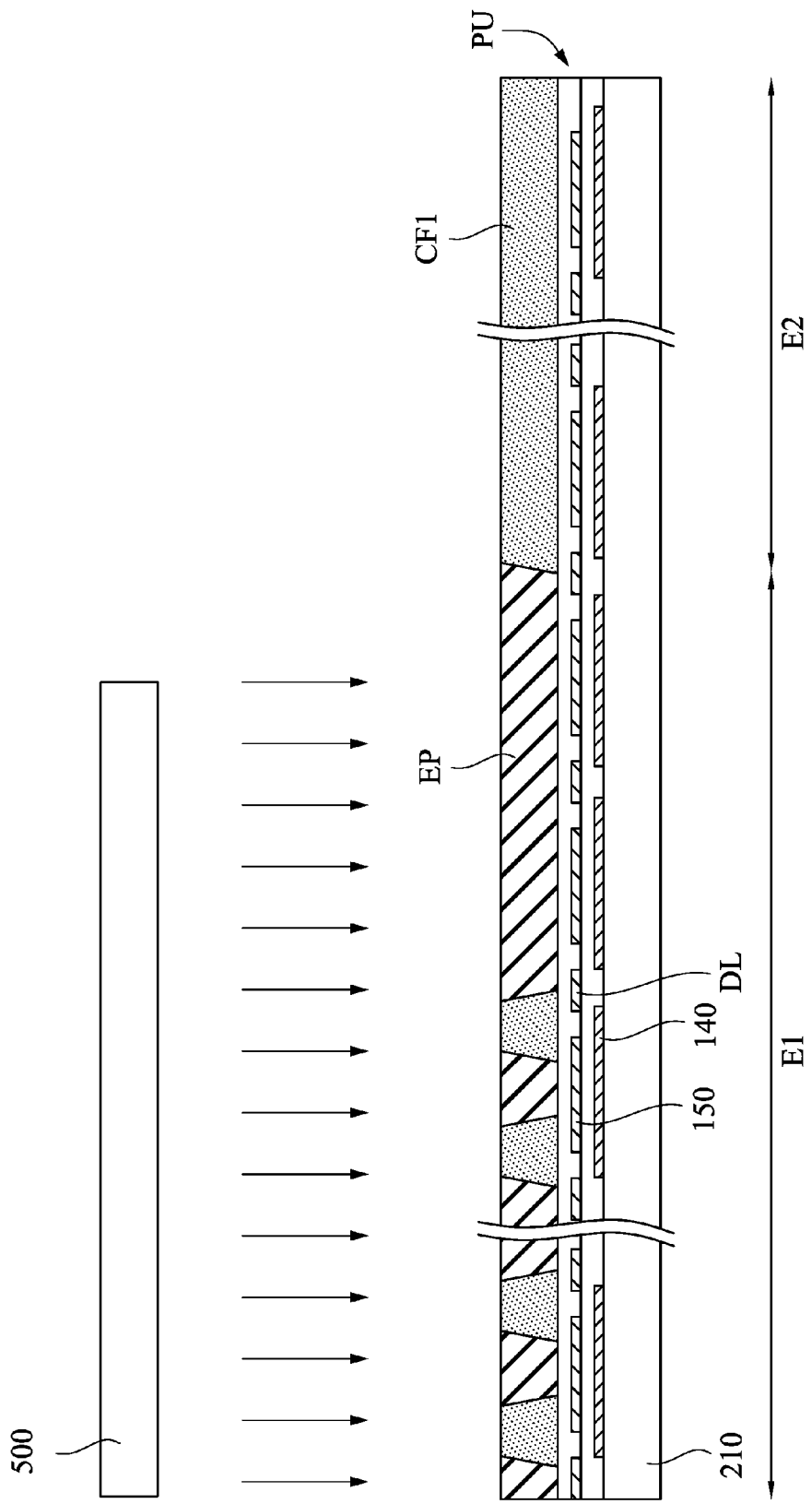

Next, come to step 420, and refer to FIG. 6B. The first color filter layer CF1 in a first exposed area E1 of the substrate 210 is exposed by using an exposure machine 500 by means of a specific exposure pattern (not drawn). Herein, the pattern is filled by using double slashes to represent an exposed part EP of the first color filter CF1.

Figure 6C:
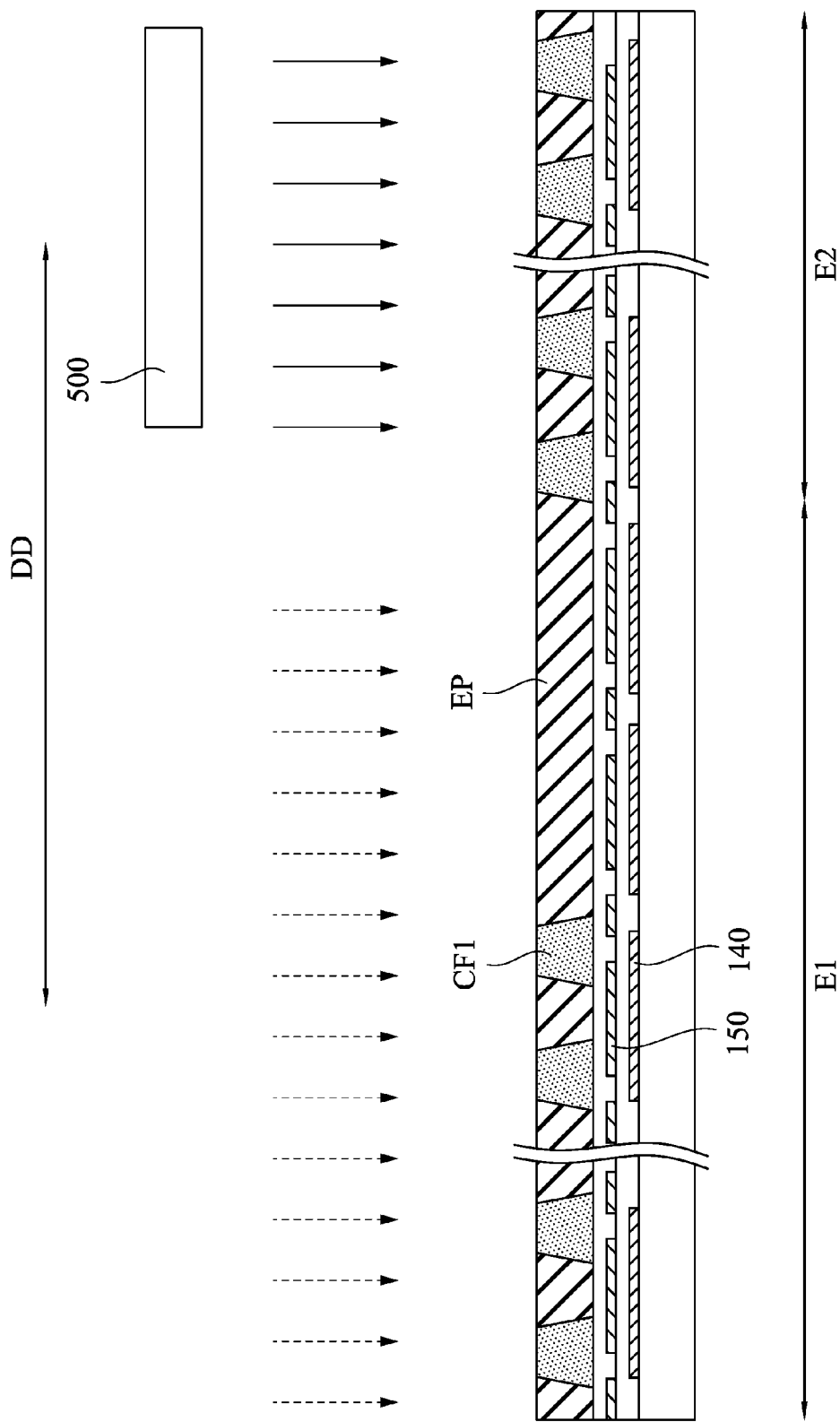

Then, come to step 430, and refer to FIG. 6C. The substrate 210 is moved by a preset distance DD. The first color filter layer CF1 in a second exposed area E2 of the substrate 210 is exposed using the exposure machine 500 by means of the specific exposure pattern (not drawn).

Herein, to save space of the drawings, sizes of elements presented in the drawings are limited. Although a size of the first exposed area E1 is different from a size of the second exposed area E2 drawn in FIG. 6A to FIG. 6E, actually, the size of the first exposed area E1 is consistent with that of the second exposed area E2, and FIG. 3A or FIG. 4 may be referred to. In FIG. 6B and FIG. 6C, the specific exposure patterns of the exposure machine 500 may be the same, so that distributions of the exposed parts EPs of the first exposed area E1 and the second exposed area E2 are approximately the same.

Figure 6D:
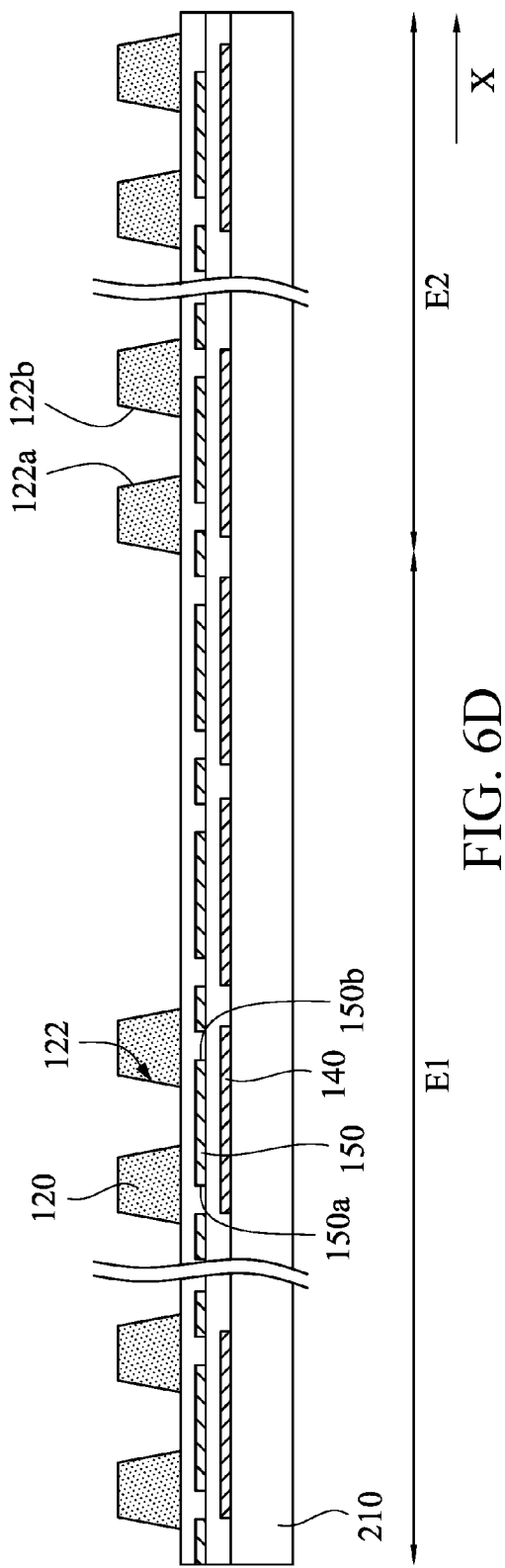

Next, come to step 440, and refer to FIG. 6D. The first color filter layer CF1 is developed and baked, and then the exposed part EP of the first color filter layer CF1 is removed to form the first color filter unit 120 having an alignment opening 122. In other words, by means of the foregoing steps 420 to 440, the first color filter layer CF1 is patterned to form at least one first color filter unit 120, where the first color filter unit 120 has the alignment opening 122, which corresponds to the top electrode 150. As shown in FIG. 1A, the conductive through hole CV1 is located outside the alignment opening 122.

Subsequently, by means of an optical detection system (not drawn), locations of two opposite edges 150a and 150b of the top electrode 150 can be detected to determine a center of the top electrode 150 in an X direction, and locations of two opposite side walls 122a and 122b of the alignment opening 122 can be detected to determine a center of the alignment opening 122 in the X direction.

According to the detection result, when a difference between locations of the center of the top electrode 150 in the X direction and the center of the alignment opening 122 in the X direction is not within a tolerable range, it can be determined to correct the patterned first color filter layer CF1. In this case, the current substrate 210 may be discarded, and steps 410 to 480 (that is, FIG. 6A to FIG. 6D) are performed again.

It should be noted that although the location difference in the X direction is calculated herein, the scope of the present invention should not be limited thereto. In certain embodiments, whether to perform correction may be determined according to a location difference in a Y direction. In certain embodiments, whether to perform correction may be determined according to location differences in the X direction and the Y direction.

Figure 6E:
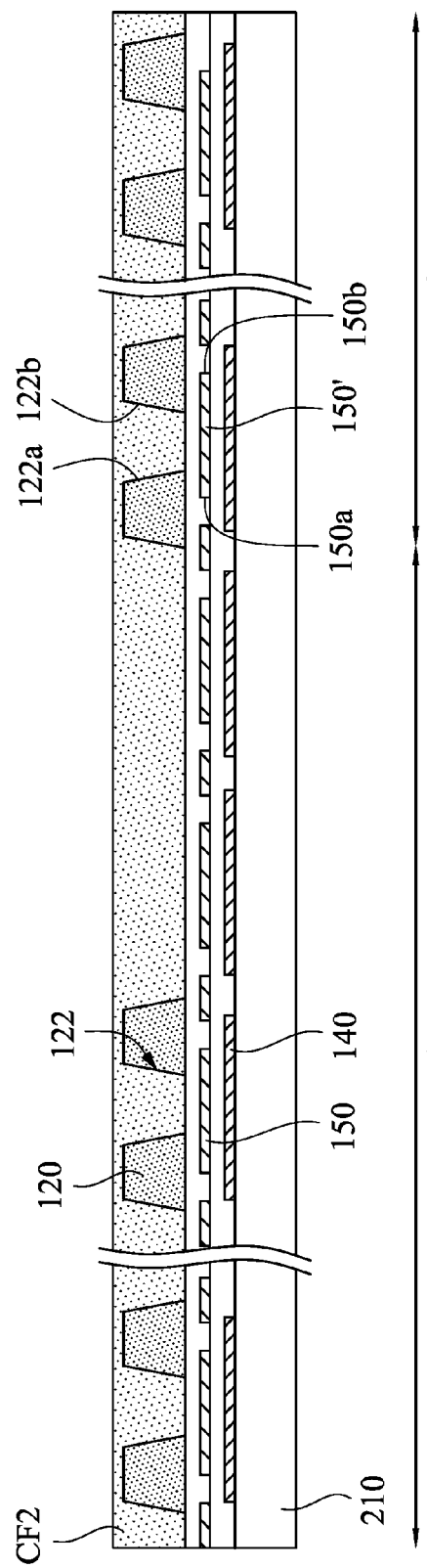

On the other aspect, according to the detection result, when the difference between the locations of the center of the top electrode 150 in the X direction and the center of the alignment opening 122 in the X direction is within the tolerable range, it can be determined to continue the process, so as to form a second color filter layer CF2 on the substrate 210. Referring to FIG. 6E, the second color filter layer CF2 may be disposed above the substrate 210 in a spin-coating manner, and the second color filter layer CF2 may cover the first color filter unit 120. For example, the second color filter layer CF2 may be a photosensitive material having a transmission spectrum with a specific spectrum, for example, a green photoresist. Herein, the second color filter layer CF2 is a positive photoresist, but the scope of the present invention should not be limited thereto. In other implementation, the second color filter layer CF2 may be a negative photoresist.

Subsequently, the second color filter layer CF2 may be patterned in a manner similar to that of steps 420 to 480, and a color filter unit (not drawn) having the alignment opening is formed by using the second color filter layer CF2 to detect a location difference, so as to determine whether to correct a patterning process of the second color filter layer CF2, and details thereof are approximately the same as steps 420 to 480, and are not described herein again.

After setting of each color filter unit 120 is completed by the correction process, a substrate disposed with a plurality of color filter units can be obtained. Subsequently, referring to FIG. 1A and FIG. 1B, the second dielectric layer I2 and the pixel electrode 130 may be sequentially formed on each color filter unit 120 on the substrate 110, where the second dielectric layer I2 has a contact hole CH1, which is located outside the alignment opening 122, and the pixel electrode 130 is electrically connected to a drain D1 through the contact hole CH1. Other details are approximately stated above, and are not described herein again.

In a process of fabricating a large-sized display device, a color filter layer usually needs to be exposed in a stitching manner. In the plurality of implementation of the present invention, in the process of detecting exposure in a stitching manner for a plurality of times by means of marked pixel units, locations of exposed areas can be selectively corrected according to whether exposure on color filter layers is aligned, so as to achieve a stitching effect with good accuracy.

The present invention is disclosed through the foregoing plurality of implementations; however, these implementations are not intended to limit the present invention. Various changes and modifications made by persons of ordinary skill in the art without departing from the spirit and scope of the present invention shall fall within the protection scope of the present invention. The protection scope of the present invention is subject to the appended claims.

What is claimed is:

1. A marked pixel unit, comprising:
   at least one active element comprising a source, a gate, and a drain;
   a first dielectric layer covering the gate;
   a color filter unit, disposed above the first dielectric layer, wherein the color filter unit has an alignment opening;
   a second dielectric layer covering the active element and the color filter unit, wherein the second dielectric layer has a contact hole;
   at least one pixel electrode, disposed above the second dielectric layer, wherein the pixel electrode is electrically connected to the drain through the contact hole, and the contact hole of the second dielectric layer is located outside the alignment opening;
   a bottom electrode of a capacitor; and
   a top electrode of the capacitor, electrically connected to the drain, wherein the first dielectric layer is disposed between the bottom electrode and the top electrode, the alignment opening of the color filter unit is disposed above the top electrode, and an area of an orthographic projection of the alignment opening on the top electrode is smaller than an area of the top electrode.

2. The marked pixel unit according to claim 1, wherein the color filter unit covers or does not cover two opposite edges of the top electrode.

3. The marked pixel unit according to claim 2, wherein an orthographic projection of each of the edges of the top electrode on an upper surface of the color filter unit is substantively parallel to an orthographic projection of each of two opposite side walls of the alignment opening of the color filter unit on the upper surface of the color filter unit.

4. The marked pixel unit according to claim 3, wherein the color filter unit does not cover the active element and the contact hole.

5. The marked pixel unit according to claim 1, wherein the color filter unit does not cover the active element and the contact hole.

6. A display device, comprising:
   a substrate; and
   at least one marked pixel unit and at least one unmarked pixel unit, respectively disposed above the substrate, wherein each of the at least one marked pixel unit and the at least one unmarked pixel unit comprises a color filter unit, wherein:
   the color filter unit of the marked pixel unit comprises an alignment opening;
   the unmarked pixel unit comprises a spacer disposed above the color filter unit of the unmarked pixel unit, wherein a first location of an orthographic projection of the spacer on the color filter unit of the unmarked pixel unit corresponds to a second location of the alignment opening in the color filter unit of the marked pixel unit;
   the substrate comprises a first exposed area and a second exposed area;
   the first exposed area has a first edge adjacent to the second exposed area and a second edge away from the second exposed area;
   the at least one marked pixel unit comprises a first marked pixel unit and a second marked pixel unit; and
   the first marked pixel unit and the second marked pixel unit are disposed in the first exposed area, and respectively adjacent to the first edge and the second edge of the first exposed area.

7. The display device according to claim 6, wherein a relative location of the spacer to the unmarked pixel unit is substantively the same as a relative location of the alignment opening to the marked pixel unit.

8. The display device according to claim 6, wherein the marked pixel unit further comprises:
   at least one active element comprising a source, a gate, and a drain;
   a first dielectric layer covering the gate, wherein the color filter unit of the marked pixel unit is disposed above the first dielectric layer;
   a second dielectric layer covering the active element and the color filter unit, wherein the second dielectric layer has a contact hole; and
   at least one pixel electrode, disposed above the second dielectric layer, wherein the pixel electrode is electrically connected to the drain through the contact hole, and the contact hole of the second dielectric layer is located outside the alignment opening.

9. The display device according to claim 6, wherein:
   the at least one marked pixel unit and the at least one unmarked pixel unit are arranged in an array; and
   the first marked pixel unit and the second marked pixel unit are located in a same row of the array.

10. The display device according to claim 9, wherein a transmission spectrum of the color filter unit of the first marked pixel unit is substantively the same as that of the color filter unit of the second marked pixel unit.

11. The display device according to claim 9, wherein the unmarked pixel unit is at least partially disposed between the first marked pixel unit and the second marked pixel unit.

12. The display device according to claim 6, wherein:
   the second exposed area has a third edge adjacent to the first exposed area and a fourth edge away from the first exposed area;
   the at least one marked pixel unit further comprises a third marked pixel unit and a fourth marked pixel unit; and
   the third marked pixel unit and the fourth marked pixel unit are disposed in the second exposed area, and are respectively adjacent to the third edge and the fourth edge of the second exposed area.

13. A method for fabricating a display device, comprising:
   forming a first color filter layer on a substrate, wherein at least one marked pixel unit is disposed above the substrate, and the marked pixel unit comprises an active element and a top electrode of a capacitor, wherein the top electrode is electrically connected to the active element;

patterning the first color filter layer to form at least one first color filter unit, wherein the first color filter unit has an alignment opening corresponding to the top electrode;

detecting a first location of the top electrode of the marked pixel unit and a second location of the alignment opening of the first color filter unit;

according to the detection result of a difference between the first location of the top electrode of the marked pixel unit and the second location of the alignment opening of the first color filter unit, determining to calibrate the patterned first color filter layer or to form a second color filter layer on the substrate; and forming a dielectric layer on the first color filter unit, wherein the dielectric layer has a contact hole located outside the alignment opening.

14. The method for fabricating a display device according to claim 13, wherein the patterning the first color filter layer comprises:

exposing the first color filter layer in a first exposed area of the substrate using an exposure machine; and moving the substrate by a preset distance, and exposing, by the exposure machine, the first color filter layer in a second exposed area of the substrate, wherein the first exposed area is adjacent to the second exposed area, and the calibrating the patterned first color filter layer comprises adjusting the preset distance.

15. The method for fabricating a display device according to claim 13, wherein the detecting the first location of the top electrode of the marked pixel unit and the second location of the alignment opening of the first color filter unit comprises:

detecting locations of two opposite edges of the top electrode to determine a center of the top electrode in a direction; and detecting locations of two opposite side walls of the alignment opening to determine a center of the alignment opening in the direction, wherein an orthographic projection of each of the edges of the top electrode on the substrate is substantively parallel to an orthographic projection of each of the side walls of the alignment opening of the color filter unit on the substrate.

* * * * *